(12) United States Patent
Jun

(10) Patent No.: US 9,634,046 B2
(45) Date of Patent: Apr. 25, 2017

(54) SEMICONDUCTOR PACKAGES INCLUDING ELECTRICAL INSULATION FEATURES

(71) Applicant: Samsung Electronics Co., Ltd., Suwon-si, Gyeonggi-do (KR)

(72) Inventor: Hyunsu Jun, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/685,898

(22) Filed: Apr. 14, 2015

(65) Prior Publication Data

US 2015/0325611 A1    Nov. 12, 2015

(30) Foreign Application Priority Data

May 12, 2014   (KR) .................. 10-2014-0056636

(51) Int. Cl.
*H01L 27/146*     (2006.01)
*H01L 23/538*     (2006.01)
(Continued)

(52) U.S. Cl.
CPC .......... *H01L 27/146* (2013.01); *H01L 23/04* (2013.01); *H01L 23/5386* (2013.01); *H01L 24/97* (2013.01); *H01L 27/0248* (2013.01); *H01L 27/14618* (2013.01); *H01L 27/14636* (2013.01); *H01L 23/49816* (2013.01); *H01L 23/49827* (2013.01); *H01L 2224/32225* (2013.01); *H01L 2224/48091* (2013.01); *H01L 2224/48227* (2013.01); *H01L 2224/48472* (2013.01); *H01L 2224/73265* (2013.01); *H01L 2924/15311* (2013.01); *H01L 2924/16195* (2013.01)

(58) Field of Classification Search
CPC ............ H01L 27/146; H01L 27/14636; H01L 27/14618; H01L 23/04; H01L 2224/48227; H01L 2924/15311; H01L 2224/48472; H01L 2224/73265; H01L 23/49816; H01L 23/49827
See application file for complete search history.

(56) References Cited

U.S. PATENT DOCUMENTS 6,266,197 B1 * 7/2001 Glenn ................ H01L 24/97
                                                      348/E5.028
7,566,854 B2   7/2009 Yang et al.
(Continued)

FOREIGN PATENT DOCUMENTS

JP    2003219235    7/2003
JP    2006173896    6/2006
(Continued)

*Primary Examiner* — David Vu
(74) *Attorney, Agent, or Firm* — Ward and Smith, P.A.

(57) ABSTRACT

A semiconductor package can include a substrate and a semiconductor chip inside the semiconductor package mounted on the substrate. A first conductive pattern can be on the substrate inside the semiconductor package and can be electrically connected to an input/output of the semiconductor chip. A holder can be on the substrate, where the holder can be configured to provide a recess in which the semiconductor chip is located. An electrically insulating adhesive layer can be configured to electrically insulate the first conductive pattern from an Electric Static Discharge (ESD) source located outside the semiconductor package and configured to adhere the holder to the substrate.

15 Claims, 35 Drawing Sheets

(51) Int. Cl.
*H01L 23/04* (2006.01)
*H01L 27/02* (2006.01)
*H01L 23/00* (2006.01)
*H01L 23/498* (2006.01)

(56) References Cited

U.S. PATENT DOCUMENTS

| | | |
|---|---|---|
| 8,139,145 B2 | 3/2012 | Ryu et al. |
| 2013/0105924 A1 | 5/2013 | Kobayashi et al. |
| 2013/0181310 A1 | 7/2013 | Jun |

FOREIGN PATENT DOCUMENTS

| | | |
|---|---|---|
| JP | 2006279353 | 10/2006 |
| KR | 20070103555 | 10/2007 |
| KR | 20100116942 | 11/2010 |
| KR | 20110034221 | 4/2011 |
| KR | 20120059184 | 6/2012 |

* cited by examiner

SEMICONDUCTOR PACKAGES INCLUDING ELECTRICAL INSULATION FEATURES

CROSS-REFERENCE TO RELATED APPLICATIONS

This U.S. non-provisional patent application claims priority under 35 U.S.C. §119 to Korean Patent Application No. 10-2014-0056636, filed on May 12, 2014, the entire contents of which are hereby incorporated herein by reference.

BACKGROUND

The present disclosure herein relates to a semiconductor device, and more particularly, to a semiconductor package and a method of fabricating the same.

Image sensors such as CCD sensors or CMOS image sensors are applied to various electronic products, such as a mobile phone, a digital camera, an optical mouse, a surveillance camera, and a biometric device. As electronic products become more compact and multi-functional, a semiconductor package including an image sensor may also become more compact/high density, lower power consumption, higher speed, higher reliability, lower price, and better image quality. In order to meet such requirements, various studies are being conducted.

SUMMARY

Embodiments of the inventive concept can provide semiconductor packages including electrical insulation features. Pursuant to these embodiments, a semiconductor package can including a package substrate including a first conductive pattern, a semiconductor chip mounted on the package substrate and electrically connected to the first conductive pattern, a holder attached to the package substrate with an adhesive layer interposed therebetween and spaced apart from the semiconductor chip, and a transparent substrate attached on the holder and overlapping the semiconductor chip, wherein the adhesive layer contacts a side of the first conductive pattern.

In some embodiments, the package substrate may include a substrate body where the first conductive pattern is disposed, a protective layer covering the substrate body and a portion of the first conductive pattern, and a second conductive pattern spaced apart from and electrically insulated from the first conductive pattern on the substrate body, wherein the adhesive layer may contact a side of the second conductive pattern.

In other embodiments, a side of the protective layer may be aligned with the side of the first conductive pattern. In still other embodiments, the semiconductor package may further include at least one remaining conductive pattern disposed between the first conductive pattern and the second conductive pattern on the substrate body and spaced apart from the first conductive pattern and the second conductive pattern, wherein the adhesive layer may contact a side of the at least one remaining conductive pattern.

In even other embodiments, a bottom end of the holder may extend between the first conductive pattern and the second conductive pattern. In yet other embodiments, the protective layer may include at least one groove exposing sides of the first and second conductive patterns, wherein the groove may have a rectangular or bar form in plan view.

In further embodiments, the adhesive layer may fill the groove.

In still further embodiments, the package substrate may further include: a substrate body where the first conductive pattern is disposed; and a protective layer covering the substrate body and a portion of the first conductive pattern, wherein the holder may extend to be adjacent to a side of the substrate body and the adhesive layer may be interposed between the holder and the side of the substrate body.

In even further embodiments, the side of the first conductive pattern may be coplanar with the side of the substrate body. In yet further embodiments, the semiconductor packages may further include a wire electrically connecting the semiconductor chip to the first conductive pattern.

In yet further embodiments, the semiconductor chip may be an image sensor chip. In yet further embodiments, a surface of the package substrate below a bottom surface of the holder may have an uneven structure. In yet further embodiments, the adhesive layer may have an electrically insulating property.

In other embodiments of the inventive concept, semiconductor packages include: a package substrate including a first conductive pattern and a second conductive pattern, which are spaced apart from each other; a semiconductor chip mounted on the package substrate, electrically connected to the first conductive pattern, and insulated from the second conductive pattern; a holder attached to the package substrate and spaced apart from the semiconductor chip; and a transparent substrate attached on the holder and overlapping the semiconductor chip.

In some embodiments, the semiconductor packages may further include an adhesive layer interposed between a bottom surface of the holder and the package substrate to attach the holder, wherein the adhesive layer may contact a side of the second conductive pattern. In other embodiments, the adhesive layer may extend to contact a side of the first conductive pattern.

In still other embodiments, the package substrate may include a substrate body disposed between the first conductive pattern and the second conductive pattern, and a protective layer covering the substrate body and an entire top surface of the second conductive pattern and covering a portion of the first conductive pattern, wherein the protective layer may include a groove exposing sides of the first and second conductive patterns. In even other embodiments, the groove may have a rectangular or bar form in plan view. In yet other embodiments, the second conductive pattern may float electrically.

In some embodiments, a semiconductor package can include a substrate and a semiconductor chip inside the semiconductor package mounted on the substrate. A first conductive pattern can be on the substrate inside the semiconductor package and can be electrically connected to an input/output of the semiconductor chip. A holder can be on the substrate, where the holder can be configured to provide a recess in which the semiconductor chip is located. An electrically insulating adhesive layer can be configured to electrically insulate the first conductive pattern from an Electric Static Discharge (ESD) source located outside the semiconductor package and configured to adhere the holder to the substrate.

In some embodiments, the semiconductor package can further include a second conductive pattern that can be laterally spaced apart from the first conductive pattern on the substrate, where the second conductive pattern can extend to outside the semiconductor package and can be exposed to contact with the ESD source, wherein the electrically insulating adhesive layer can extend on the substrate from beneath the holder to the second conductive pattern.

In some embodiments, a bottom surface of the holder can be coupled to the electrically insulating adhesive layer. In some embodiments, the bottom surface of the holder can extend over the first and second conductive patterns and can bridge a separation between the first and second conductive patterns to define a groove. In some embodiments, the electrically insulating adhesive layer can fill the groove between the first and second conductive patterns.

In some embodiments, the semiconductor package can further include a remaining conductive pattern that can be on the substrate between the first and second conductive patterns to divide the separation, where the electrically insulating adhesive layer fills a remaining portion of the groove. In some embodiments, the bottom surface of the holder can extend into the groove past upper surfaces of the first and second conductive patterns. In some embodiments, the electrically insulating adhesive layer can be between a side wall of the substrate and a side wall of the holder.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 3A and FIG. 5A to FIG. 7A are plan views sequentially illustrating processes for fabricating a semiconductor package of FIG. 1A;

FIG. 3B and FIG. 5B to FIG. 7B are cross-sectional views taken along lines C-C' of FIG. 3A and FIG. 5A to FIG. 7A, respectively;

FIG. 3C, FIG. 4B, and FIG. 5C to 7C are enlarged views of a portion P2 of FIG. 3B, FIG. 4A, and FIG. 5B to 7B;

DETAILED DESCRIPTION OF THE EMBODIMENTS

Figure 1A:
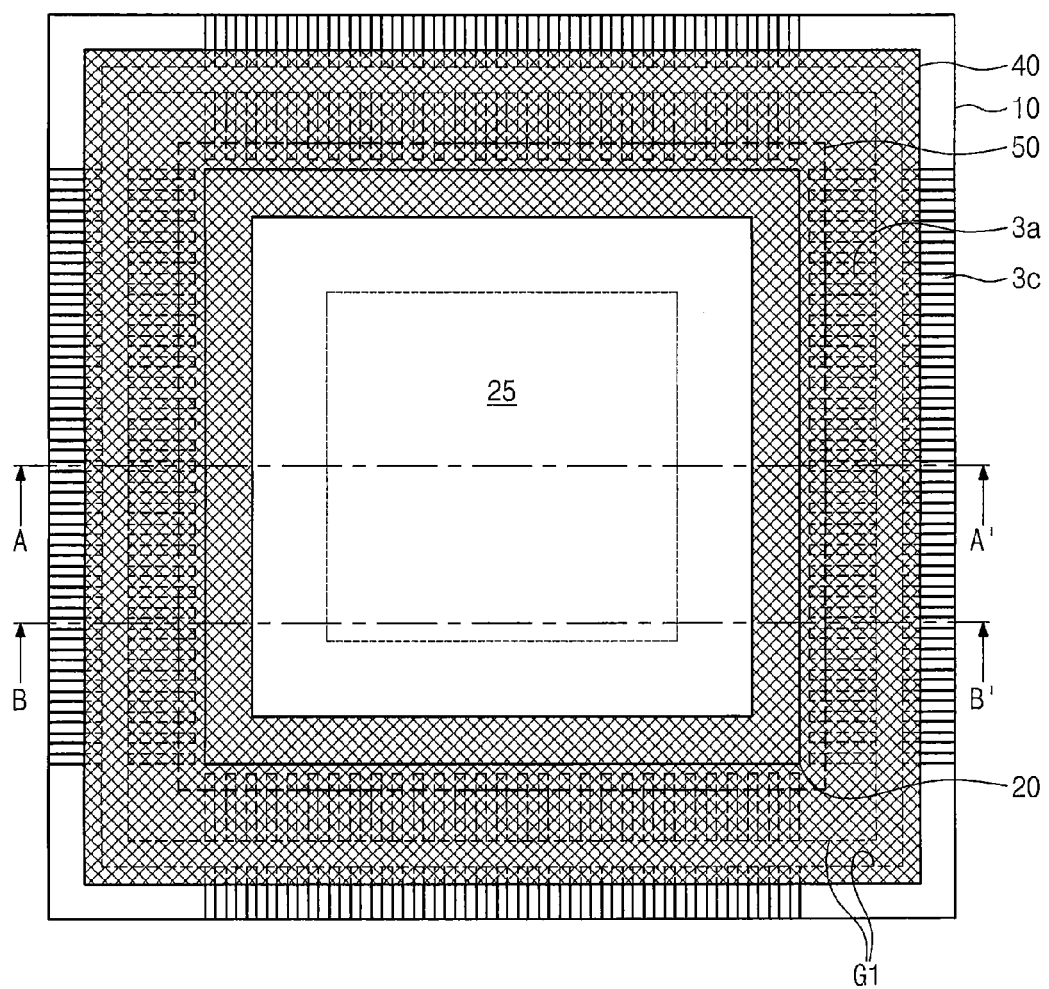
FIGS. 1A and 1B are plan views of a semiconductor package according to some embodiments of the inventive concept.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, primary, second, secondary etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 1B:
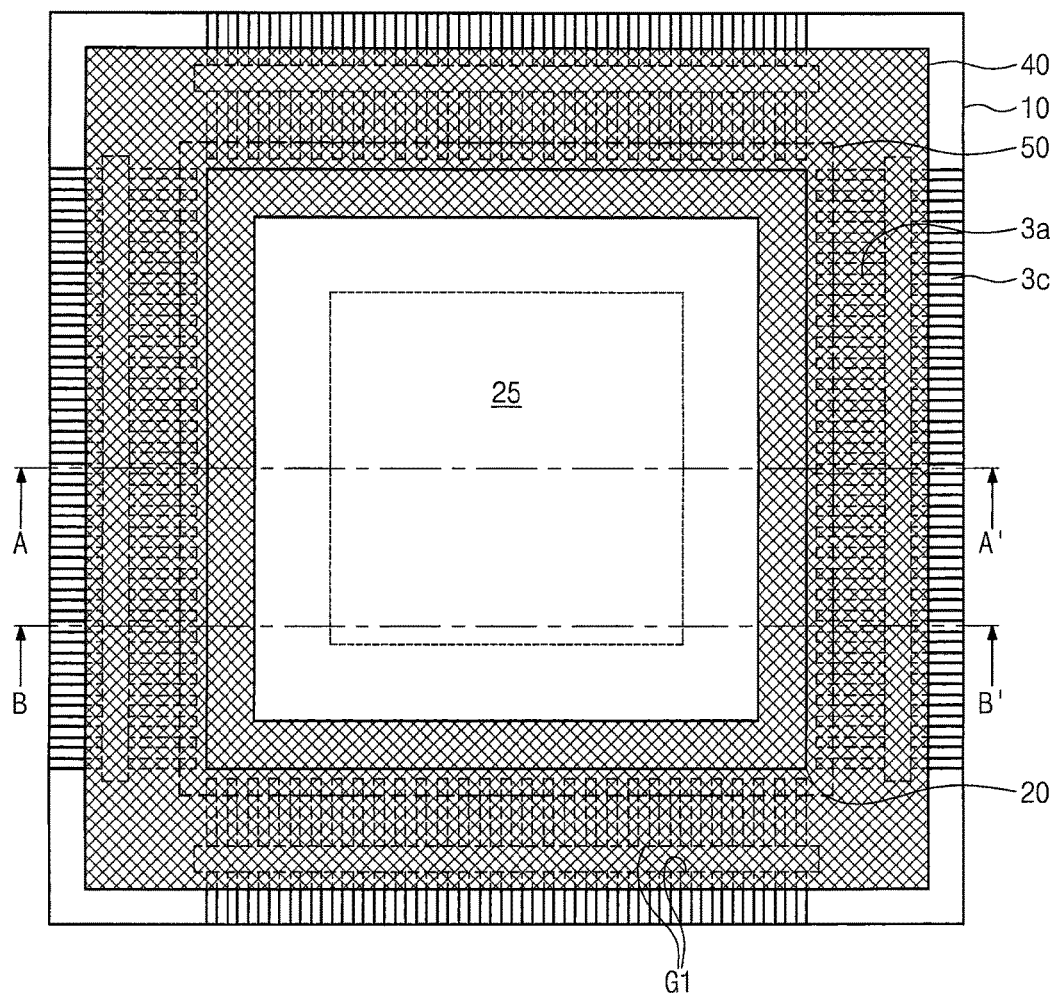
Figure 2A:
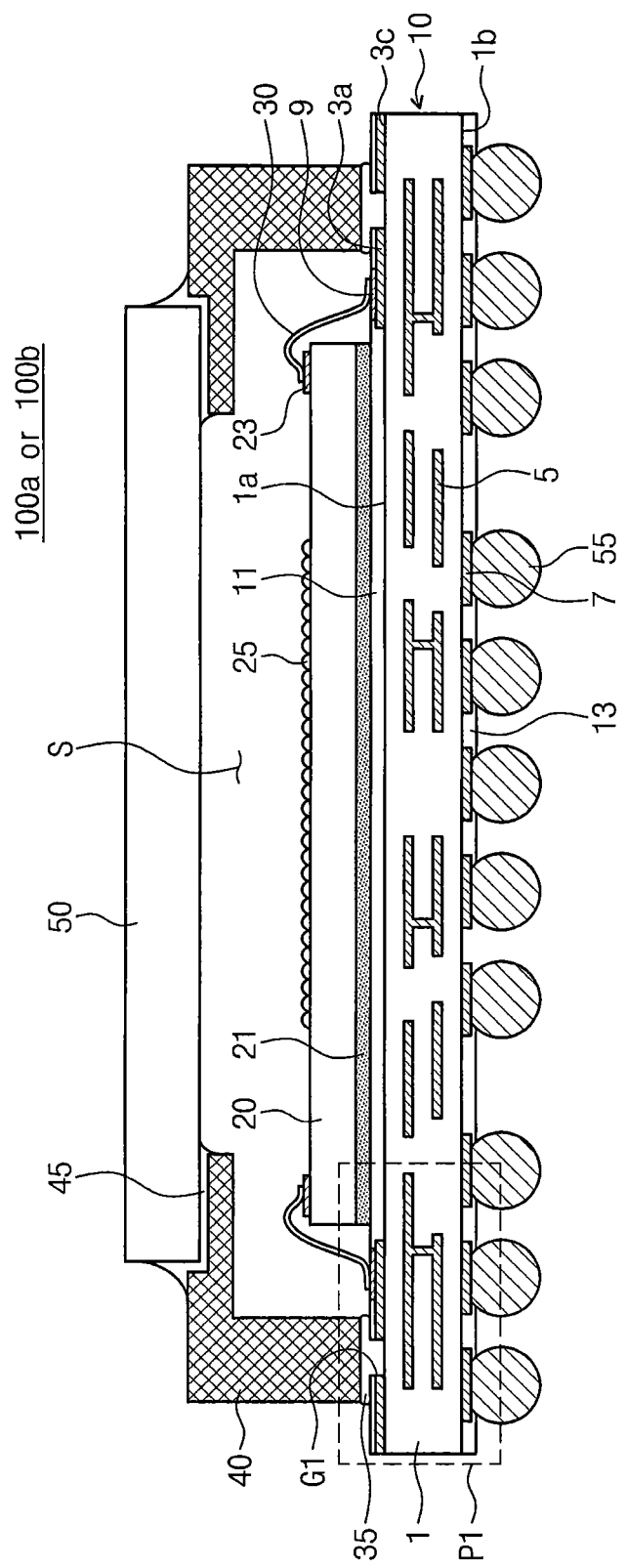
FIG. 2A is a sectional view taken along a line A-A' of FIG. 1A or FIG. 1B according to some embodiments of the inventive concept.
Figure 2B:
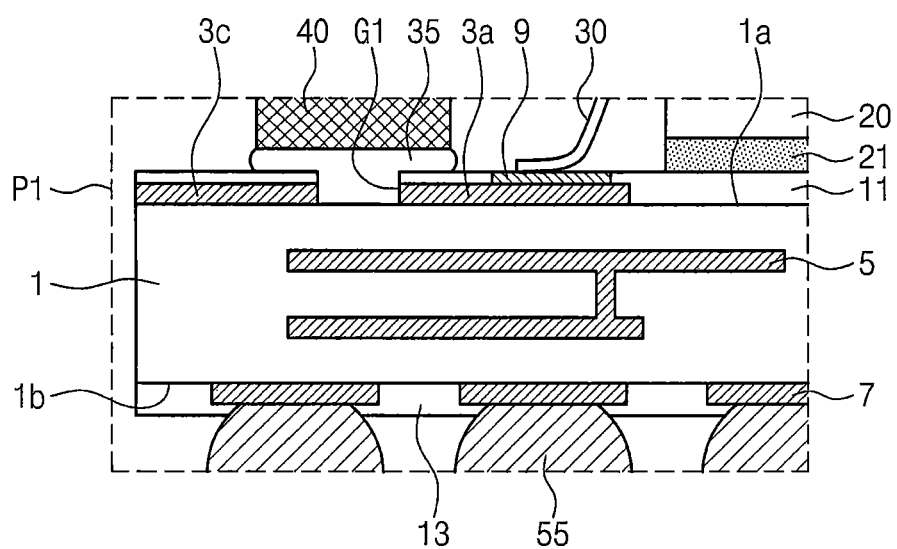
FIG. 2B is an enlarged view of a portion P1 of FIG. 2A.
Figure 2C:
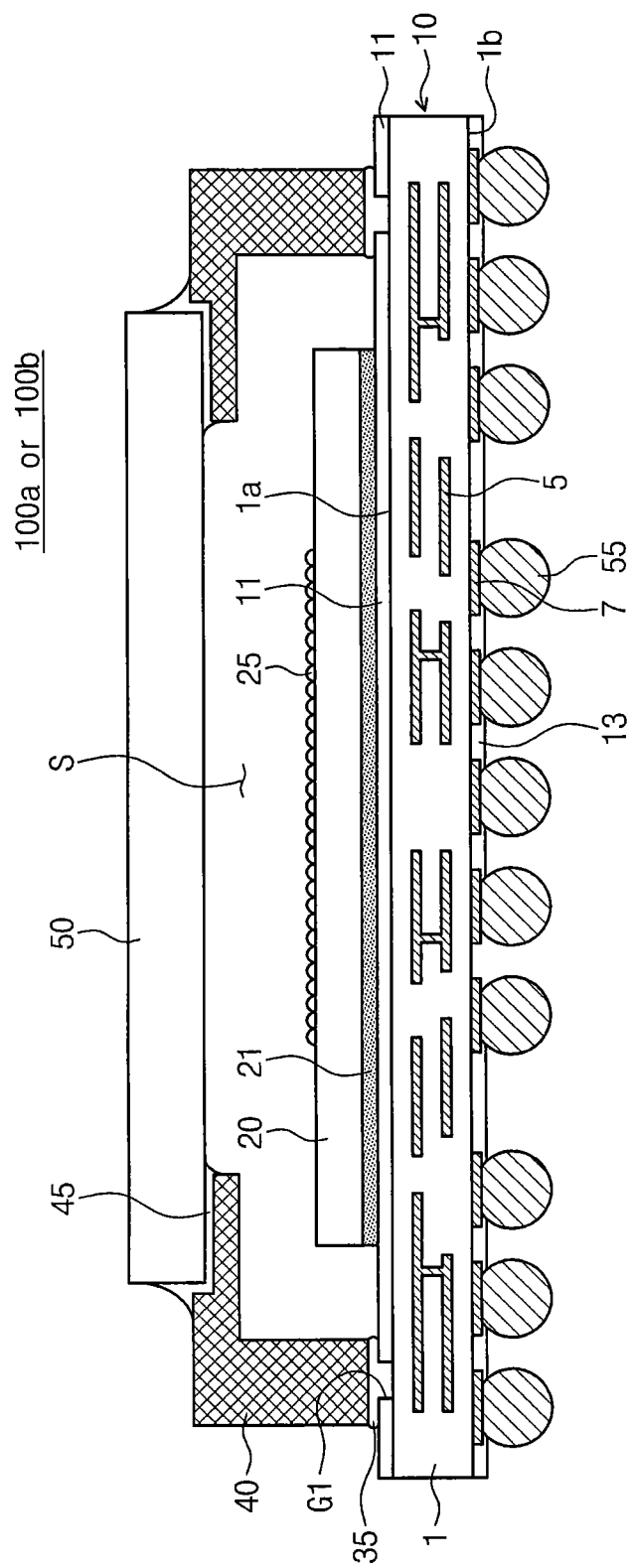
FIG. 2C is a sectional view taken along a line B-B' of FIG. 1A or FIG. 1B according to some embodiments of the inventive concept.

FIGS. 1A and 1B are plan views of a semiconductor package according to some embodiments of the inventive concept. FIG. 2A is a sectional view taken along a line A-A' of FIG. 1A or FIG. 1B according to some embodiments of the inventive concept. FIG. 2B is an enlarged view of a portion P1 of FIG. 2A. FIG. 2C is a sectional view taken along a line B-B' of FIG. 1A or FIG. 1B according to some embodiments of the inventive concept.

Referring to FIGS. 1A, 1B, 2A, and 2B, a semiconductor package 100a or 100b includes a semiconductor chip 20 mounted on a package substrate 10. The package substrate 10 includes a substrate body 1 and a first side 1a and a second side 1b facing each other. The substrate body 1 may be formed of various insulating materials such as plastic material or ceramic material. Internal wires 5 may be disposed inside the substrate body 1. First conductive patterns 3a and second conductive patterns 3c, which are insulated and separated from each other, are disposed on the first side 1a. The first conductive patterns 3a may be electrically connected to the semiconductor chip 20 and may be electrically connected to the internal wires 5. However, the second conductive patterns 3c are electrically insulated from the semiconductor chip 20. The second conductive patterns 3c may be electrically floated. For example, the second conductive patterns 3c may not be electrically connected to any other portion of the package substrate 10. The first conductive patterns 3a may be disposed adjacent to the semiconductor chip 20. The second conductive patterns 3c may be disposed adjacent to an outer side of the semiconductor substrate 10. A first protective layer 11 is disposed on the first side 1a to partially cover the top surfaces of the first conductive patterns 3a and to entirely cover the top surfaces of the second conductive patterns 3c. A groove G1 may be formed in the first protective layer 11 so that the sides of the first conductive patterns 3a and the second conductive patterns 3c may be exposed by the groove G1. The groove G1 may have a rectangular form in plan view as shown in FIG. 1A or may have a bar form facing each other as shown in FIG. 1B. In other words, portions of the groove G1 may be located on each side of the semiconductor chip 20 or the groove G1 may be continuous around all sides of the semiconductor chip 20.

A portion of the first conductive patterns 3a may be covered by a conductive pad 9. The first and second conductive patterns 3a and 3c and the internal wires 5 may be formed of copper. The conductive pad 9 may be formed of at least one of nickel and gold. Ball lands 7 are disposed on the second side 1b. A solder bump 55 may be attached to the ball lands 7 of the package substrate 10. A second protective layer 13 is disposed on the second side 1b to cover a portion of the ball lands 7. The protective layers 11 and 13 may be formed of a photosolder resist layer.

The semiconductor chip 20 is mounted on the first side 1a. The semiconductor chip 20 may be an image sensor chip, for example. The semiconductor chip 20 may include a pixel part disposed at the center and an edge part disposed at the edge of the semiconductor chip 20. A plurality of photoelectric conversion units and a plurality of transistors for delivering and processing signals transmitted from the photoelectric conversion units may be disposed in the pixel part. A micro lens array 25 may be disposed on the pixel part. Peripheral circuits may be disposed in the edge part. A chip connection terminal 23 may be disposed in the edge part of the semiconductor chip 20.

The semiconductor chip 20 may be attached by applying a first adhesive layer 21 on the first protective layer 11. In this embodiment, the semiconductor chip 20 may be mounted on the package substrate 10 through a wire bonding method. Thereby, the chip connection terminal 23 and the first conductive patterns 3a may be electrically by connected a wire 30.

A holder 40 can be attached by applying a second adhesive layer 35 on the package substrate 10. The holder 40 may have a closed curve form in plan view. In some embodiments, the holder 40 may have an outer perimeter that covers the edge part but is open over the pixel part. The holder 40 is spaced apart from the semiconductor chip 20. The holder 40 may be formed of polymer material such as polyamide. The holder 40 may cover the edge part of the semiconductor chip 20 but may expose the micro lens array 25 of the pixel part. A transparent substrate 50 can be attached by applying a third adhesive layer 45 on the holder 40. A space S is provided between the transparent substrate 50 and the semiconductor chip 20. In some embodiments, the space S is empty. The transparent substrate 50 may be formed of transparent glass or plastic.

The adhesive layers 21, 35, and 45 may have insulating property. The second adhesive layer 35 may extend into the groove G1 and contact the sides of the first and second conductive patterns 3a and 3c. Accordingly, since the second conductive patterns 3c are insulated from the first conductive patterns 3a, even if an ESD source contacts the outside of the semiconductor package while the semiconductor package 100a or 100b is being fabricated or operating, since the first conductive patterns 3a is insulated from the second conductive patterns 3c, static is not delivered to the semiconductor chip 20, the relay preventing ESD damage to the semiconductor chip 20. Additionally, even if moisture penetrates through the second conductive patterns 3c in a high temperature and high humidity test environment after the semiconductor package 100a or 100b is fabricated, since the moisture is block by the second adhesive layer 35, it is not delivered to the first conductive patterns 3a. Therefore, the deformation of the first conductive patterns 3a due to moisture for example, may be prevented. Thereby, the reliability of the semiconductor package 100a or 100b may be improved.

Figure 8:
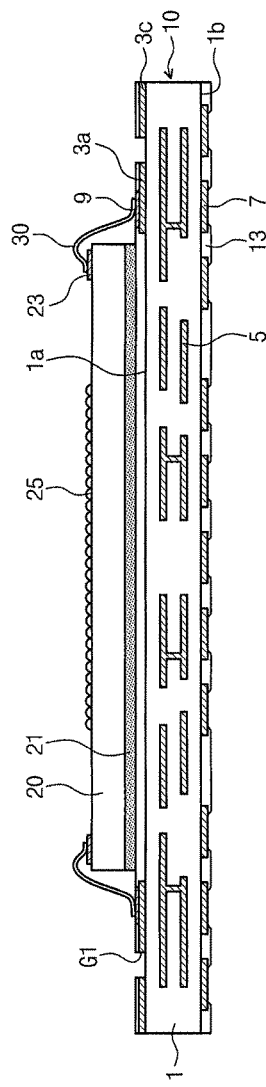
Figure 9:
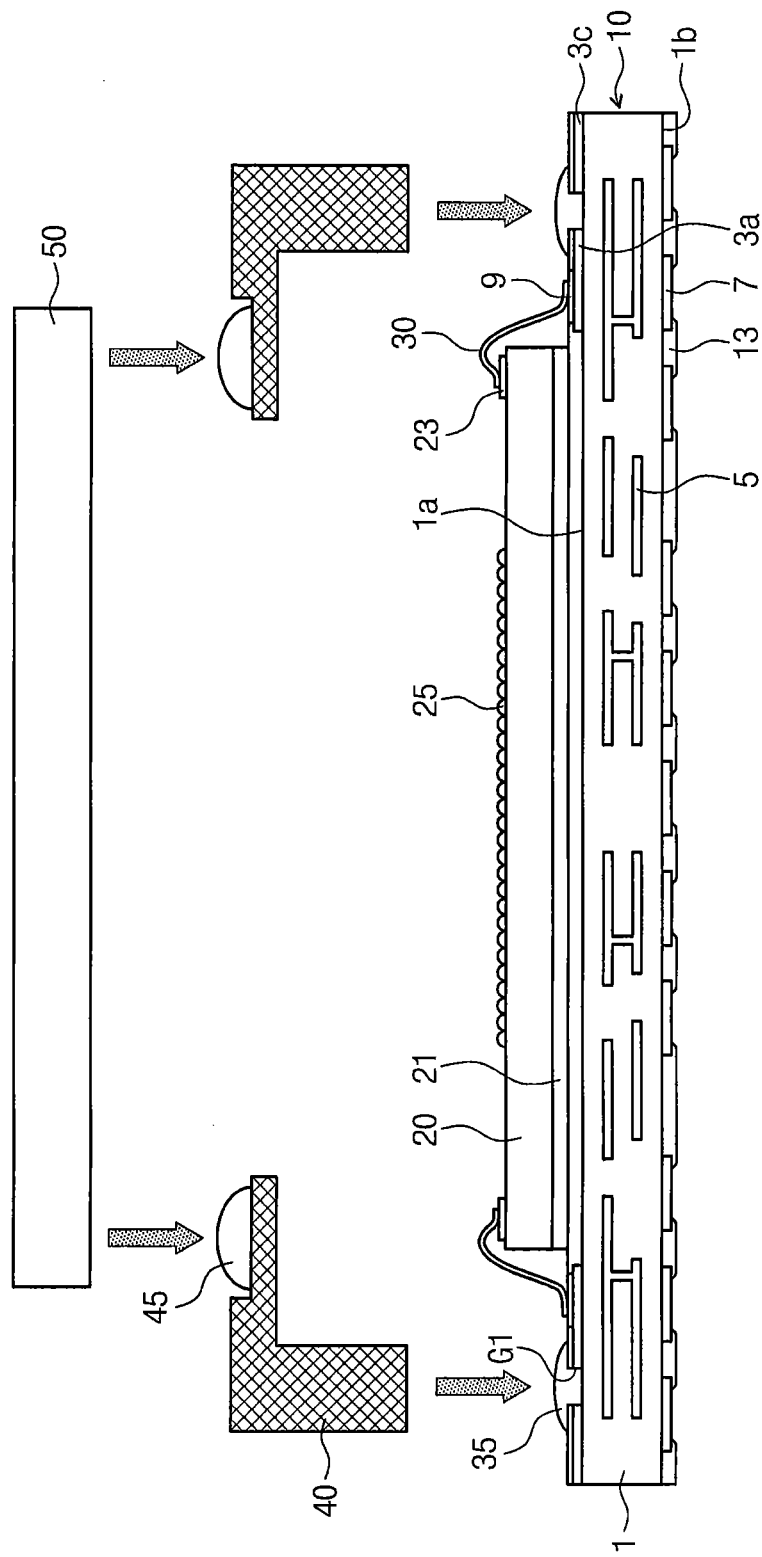

FIG. 3A and FIG. 5A to FIG. 7A are plan views sequentially illustrating processes for fabricating the semiconductor package of FIG. 1A. FIG. 3B and FIG. 5B to FIG. 7B are cross-sectional views taken along lines C-C of FIG. 3A and FIG. 5A to FIG. 7A, respectively. FIGS. 4A, 8, and 9 are cross-sectional views illustrating processes for fabricating the semiconductor package of FIG. 2A. FIG. 3C, FIG. 4B, and FIG. 5C to 7C are enlarged views of a portion P2 of FIG. 3B, FIG. 4A, and FIG. 5B to 7B.

Figure 3A:
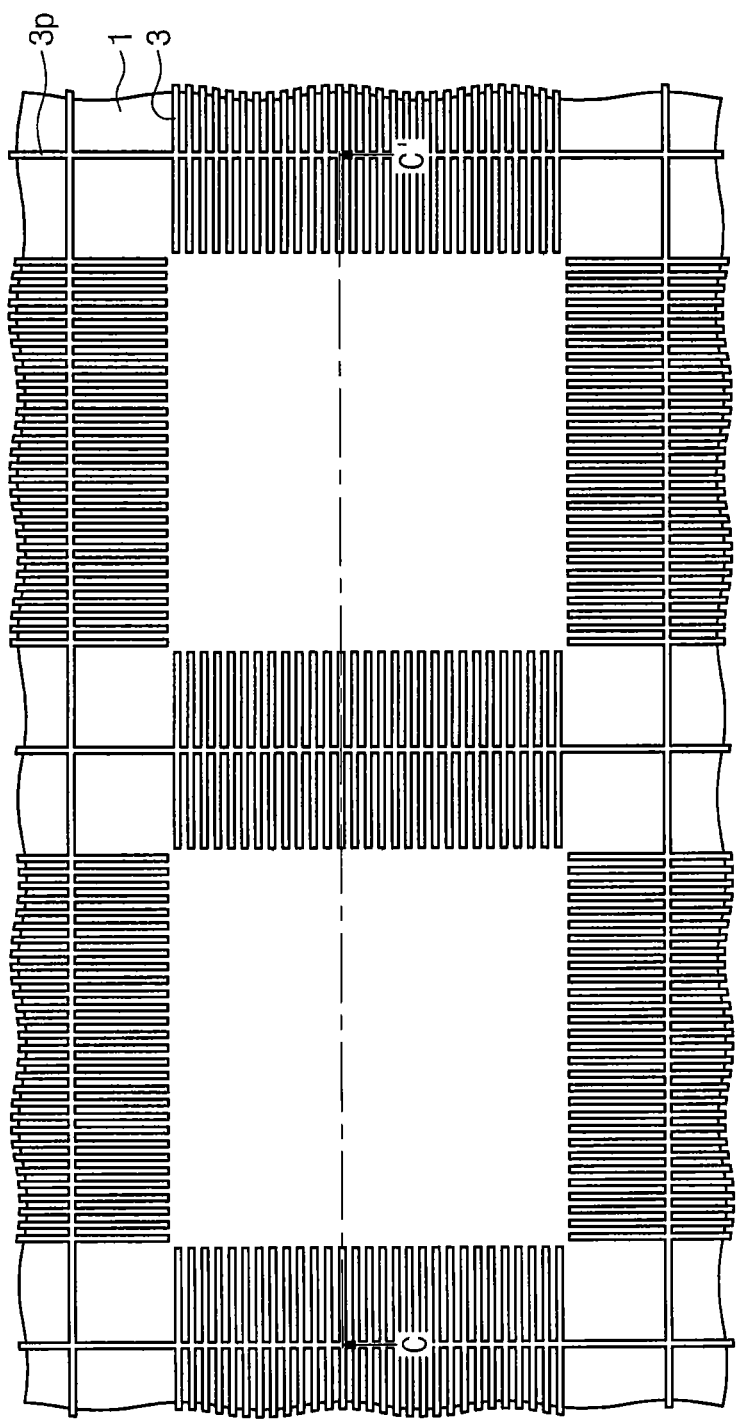
Figure 3B:
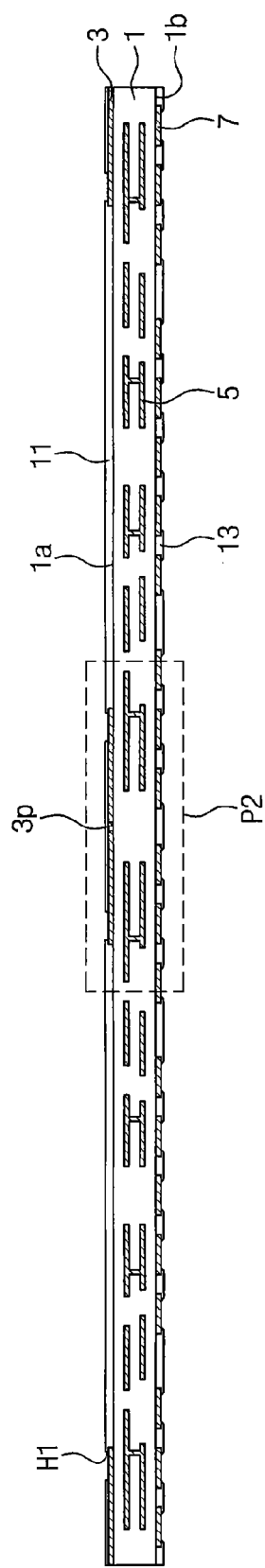
Figure 3C:
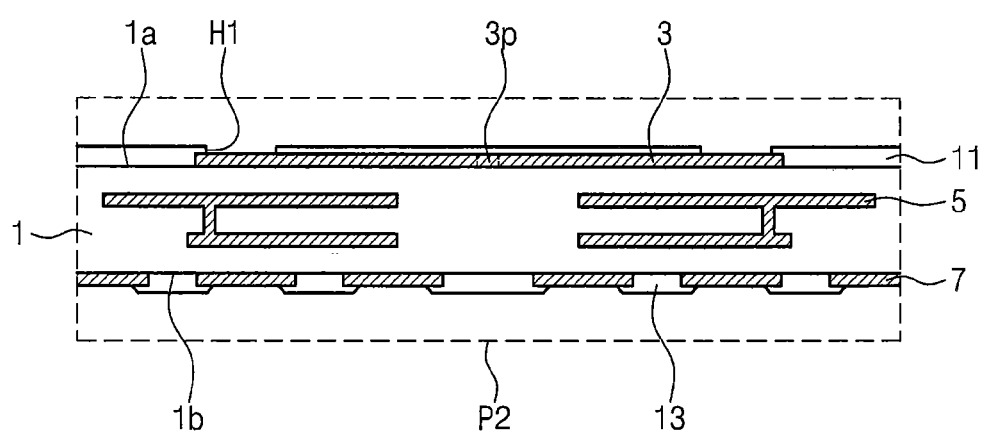
Figure 4A:
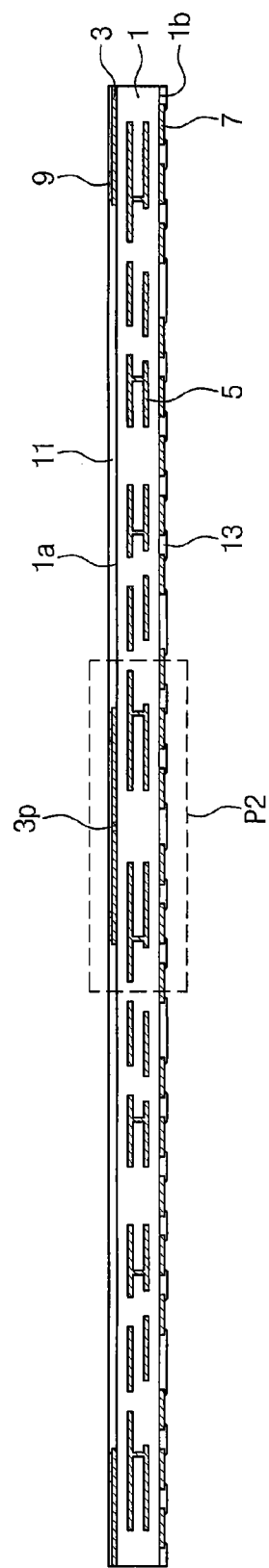
FIGS. 4A, 8, and 9 are cross-sectional views illustrating processes for fabricating a semiconductor package of FIG. 2A.

Referring to FIGS. 3A to 3C, first, a substrate body 1 in a strip level is prepared. The substrate body 1, as a printed circuit substrate, may be formed through a low temperature co-fired ceramic process. Internal wires 5 may be disposed inside the substrate body 1. Conductive lines 3 are disposed at a first side 1a of the substrate body 1 and are covered by a first protective layer 11. Ball lands 7 and a second protective layer 13 may be disposed at a second side 1b of the substrate body 1. The conductive lines 3 may be formed to be all connected to each other by a plating line 3p as shown in FIG. 3A. The first protective layer 11 may include holes H1 exposing a portion of the end parts of the conductive lines 3. The conductive lines 3 and the internal wires 5 may be formed of copper, for example.

Figure 4B:
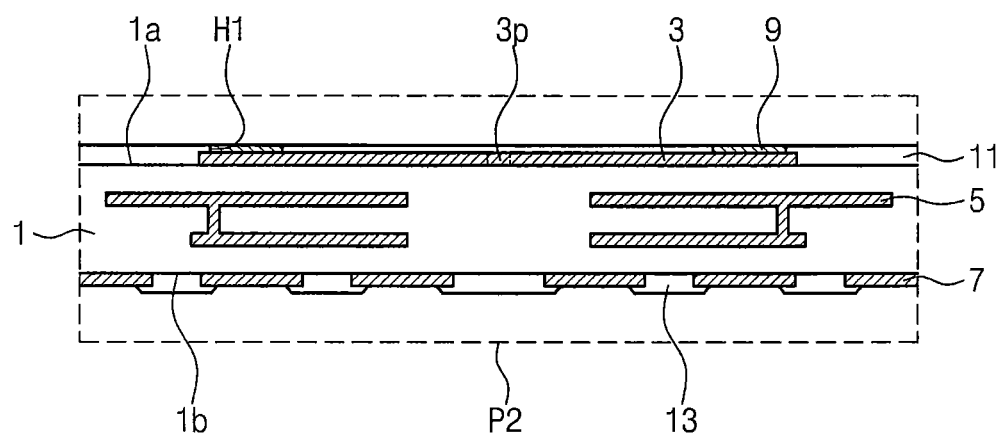

Referring to FIGS. 4A and 4B, a conductive pad 9 is formed on the end parts of the conductive lines 3 exposed by the holes H1 by performing a plating process. The conductive pad 9 may be formed of at least one of nickel and gold, for example. The plating process may be performed by applying voltage to the plating line 3p.

Figure 5A:
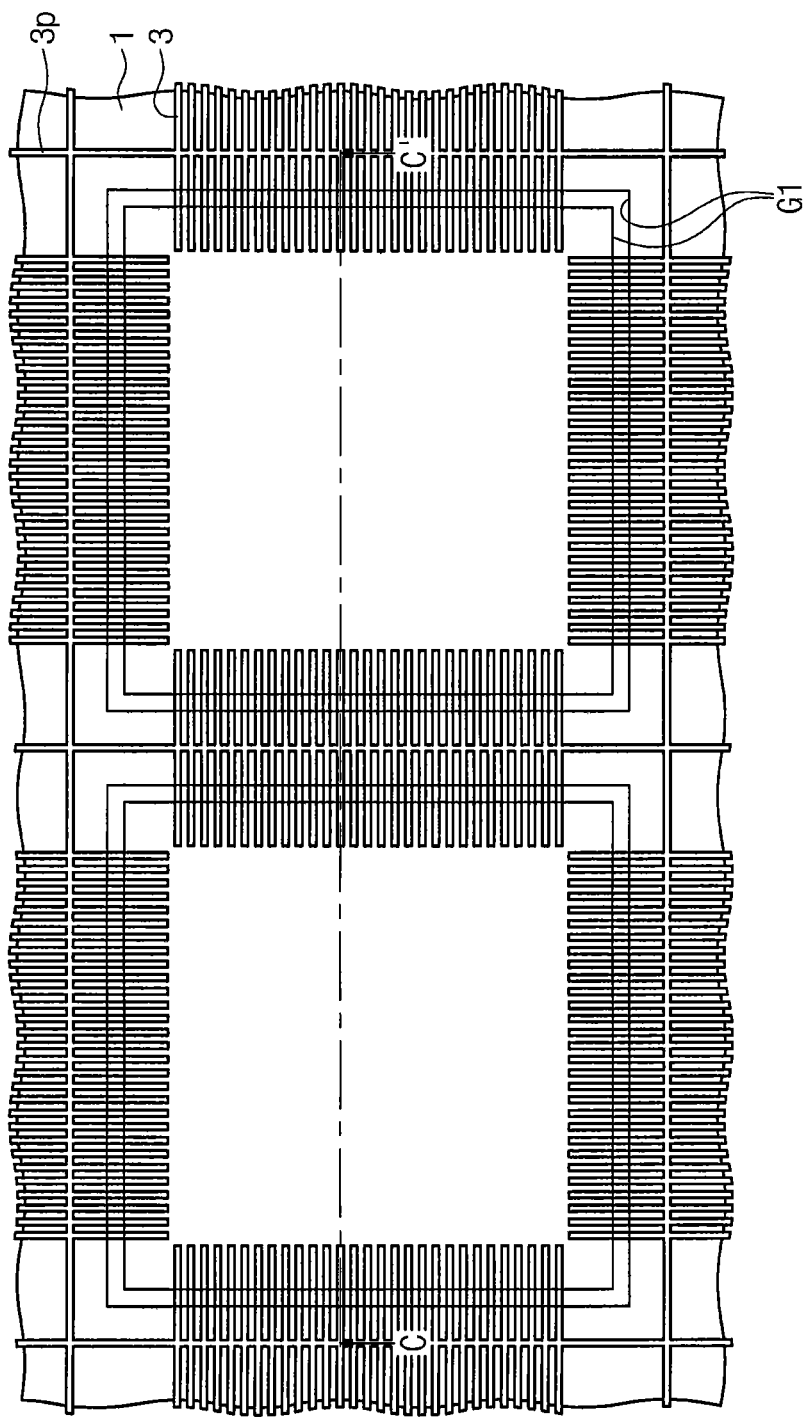
Figure 5B:
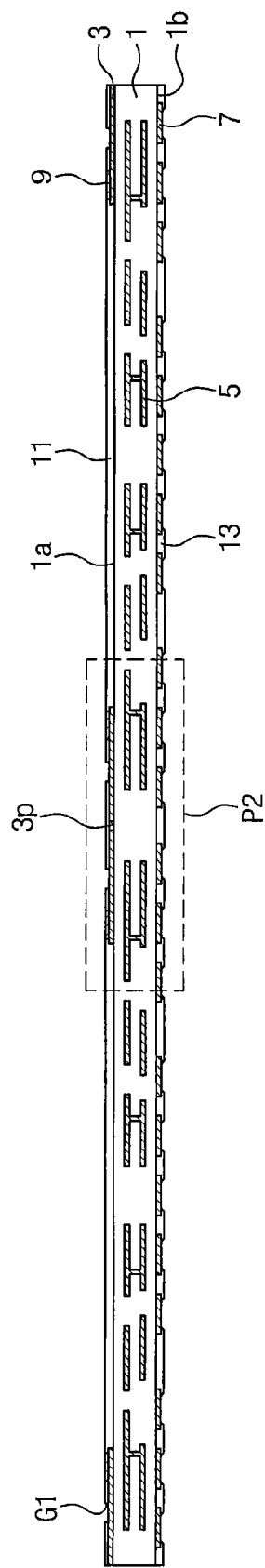
Figure 5C:
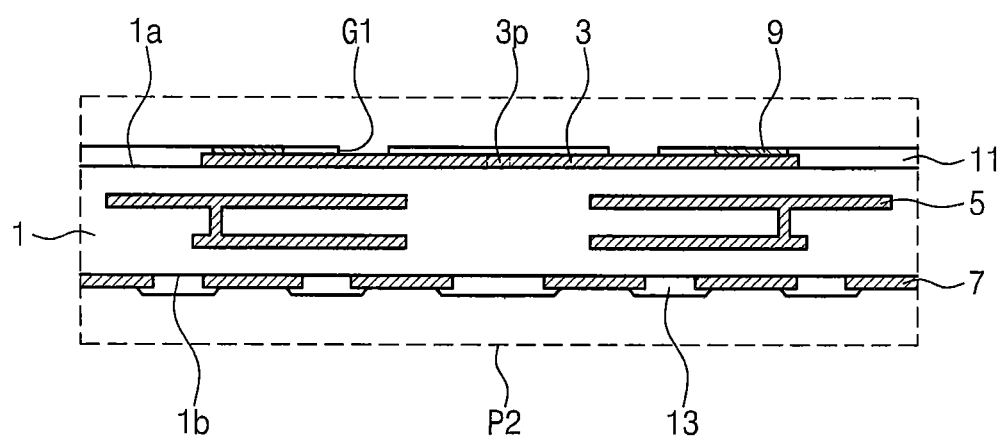

Referring to FIGS. 5A to 5C, a groove G1 is formed by patterning the first protective layer 11 laterally spaced away from the conductive pad 9. At this point, the groove G1 may have a rectangular form in plan view. A portion of the conductive lines 3 between the conductive pad 9 and the plating line 3p is exposed in the groove G1. In some embodiments, the groove G1 has a rectangular form as shown in FIG. 1A. In some embodiments, the groove G1 may be formed in a bar form as shown in FIG. 1B.

Figure 6A:
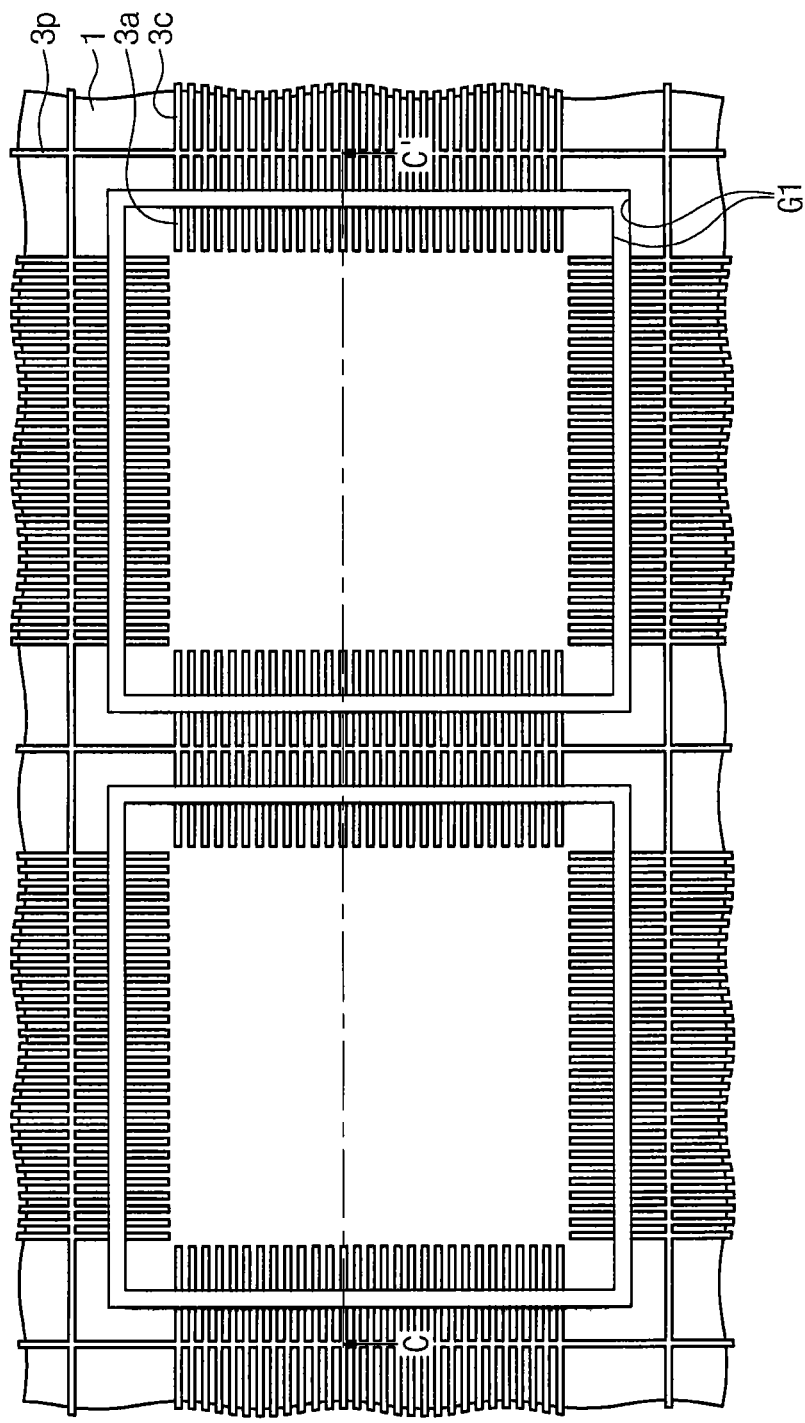
Figure 6B:
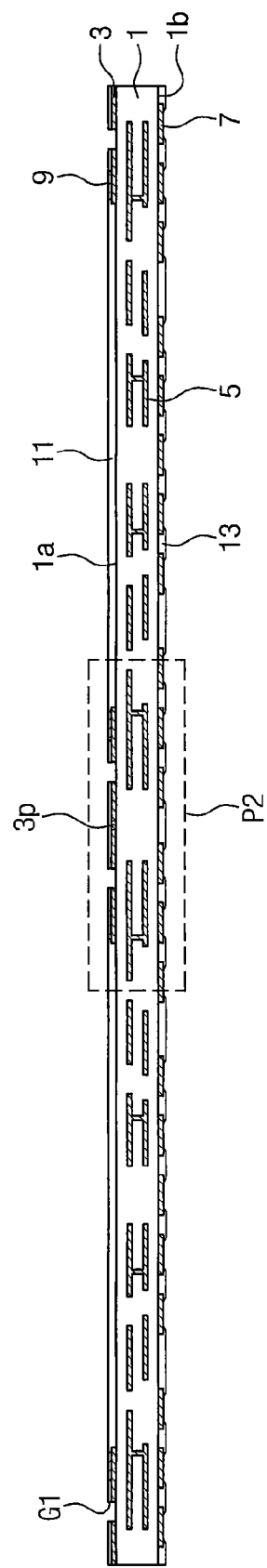
Figure 6C:
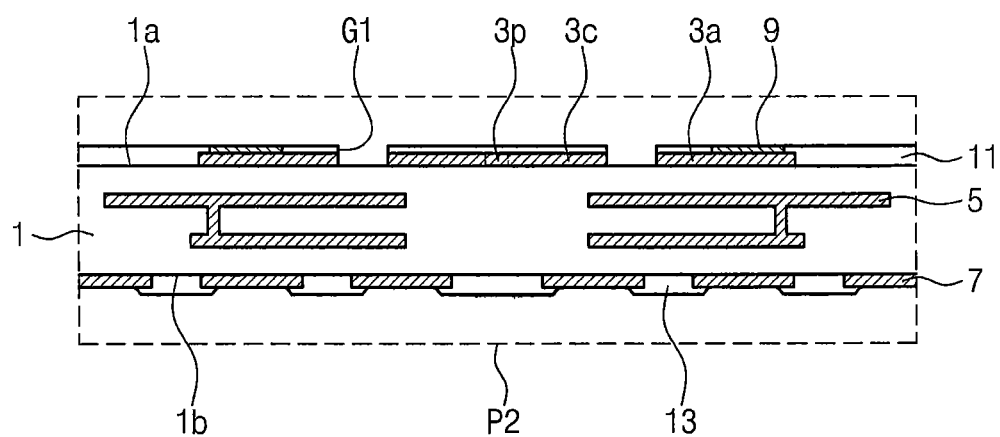

Referring to FIGS. 6A to 6C, by removing the conductive lines 3 exposed in the groove G1, the conductive lines 3 are divided into first conductive patterns 3a and second conductive patterns 3c. The first conductive patterns 3a may be disposed inside a rectangular perimeter defined by the groove G1 and the second conductive patterns 3c may be disposed outside the rectangular perimeter and can be electrically connected to the plating lines 3p.

Figure 7A:
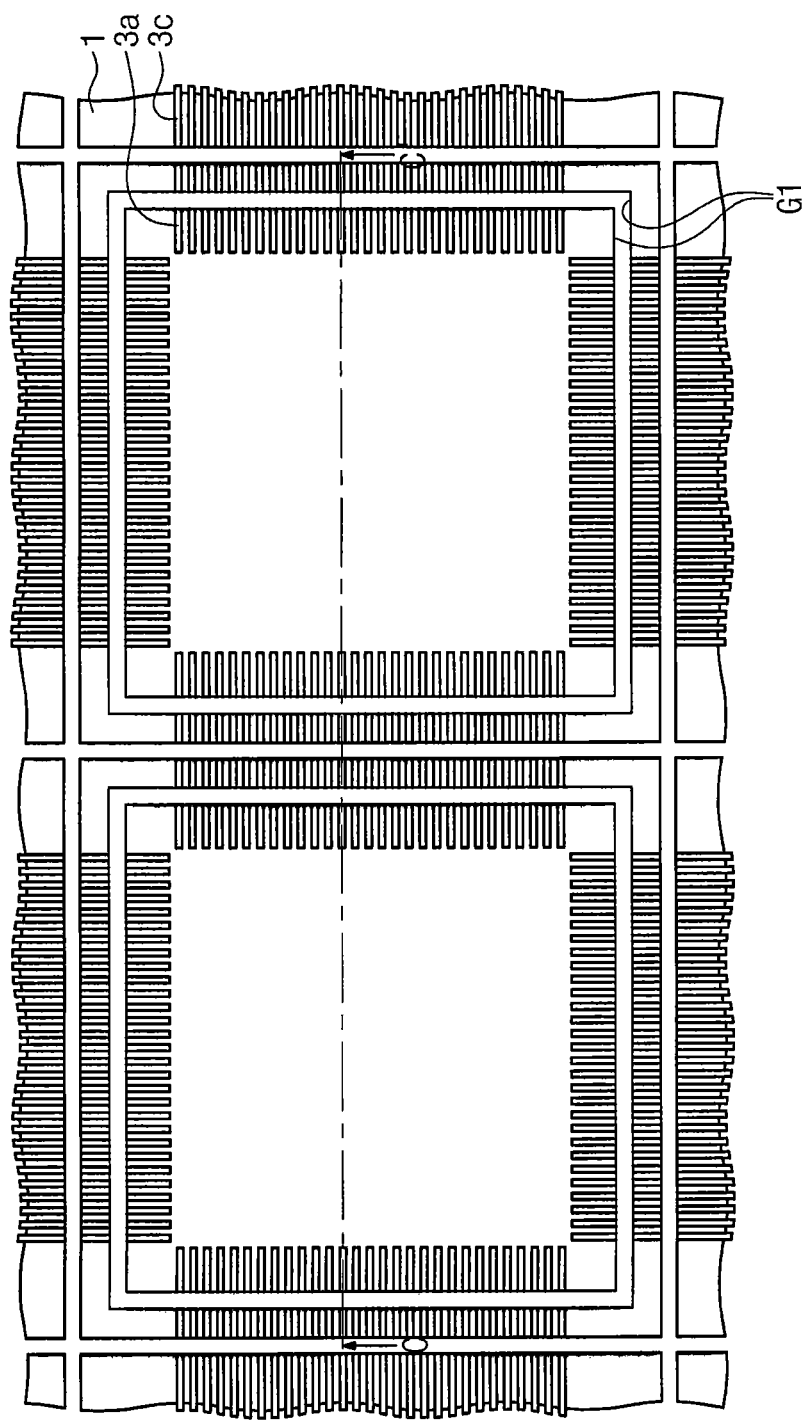
Figure 7B:
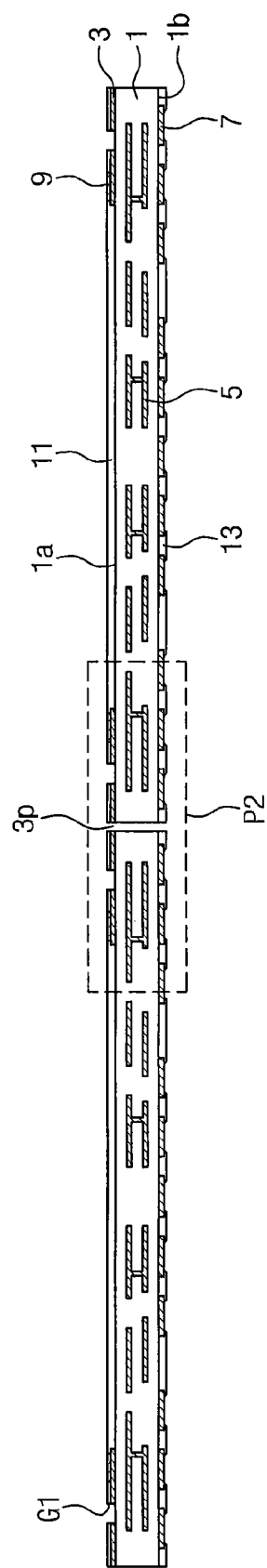
Figure 7C:
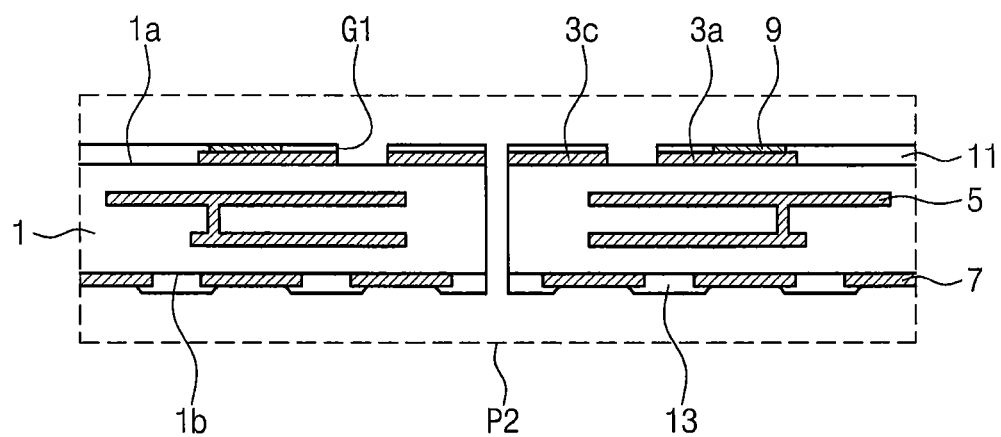

Referring to FIGS. 7A to 7C, by cutting the substrate body 1 along the plating line 3p to remove the plating lines 3p, unit package substrates 10 can be formed. Thereby, the second conductive patterns 3c may be separated from each other.

Referring to FIG. 8, a semiconductor chip 20 is mounted on the package substrate 10 using a wire bonding method. That is, the semiconductor chip 20 is attached by applying a first adhesive layer 21 on the package substrate 10 and the chip connection terminal 23 and the conductive pad 9 are electrically connected to each other by the wire 30.

Referring to FIG. 9, a second adhesive layer 35 is disposed in and around the groove G1 and the bottom surface of the holder 40 is placed on the second adhesive layer 35, so that the holder 40 is attached to the package substrate 10. Then, a third adhesive layer 45 is placed at a top surface of the holder 40 to contact the edge of a transparent substrate 50 to be attached to the holder 40.

Figure 10:
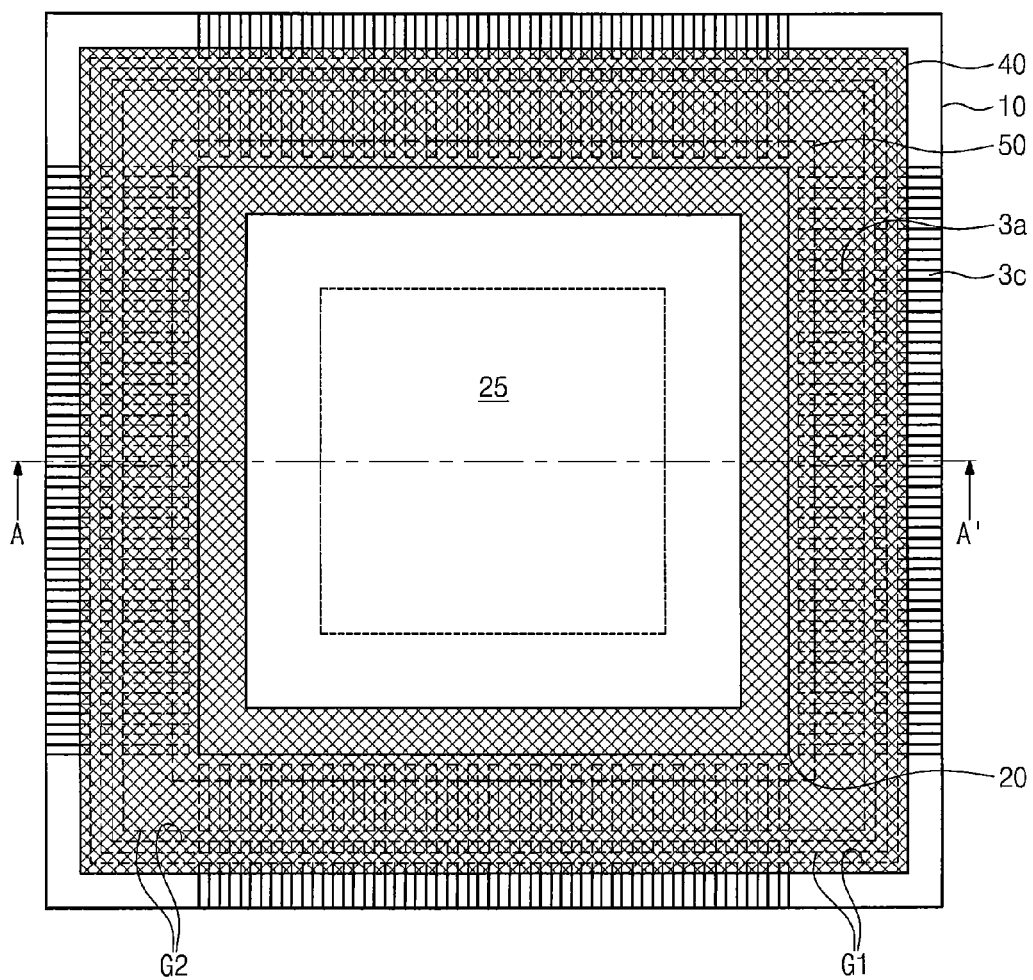
FIG. 10 is a plan view of a semiconductor package according to some embodiments of the inventive concept.
Figure 11A:
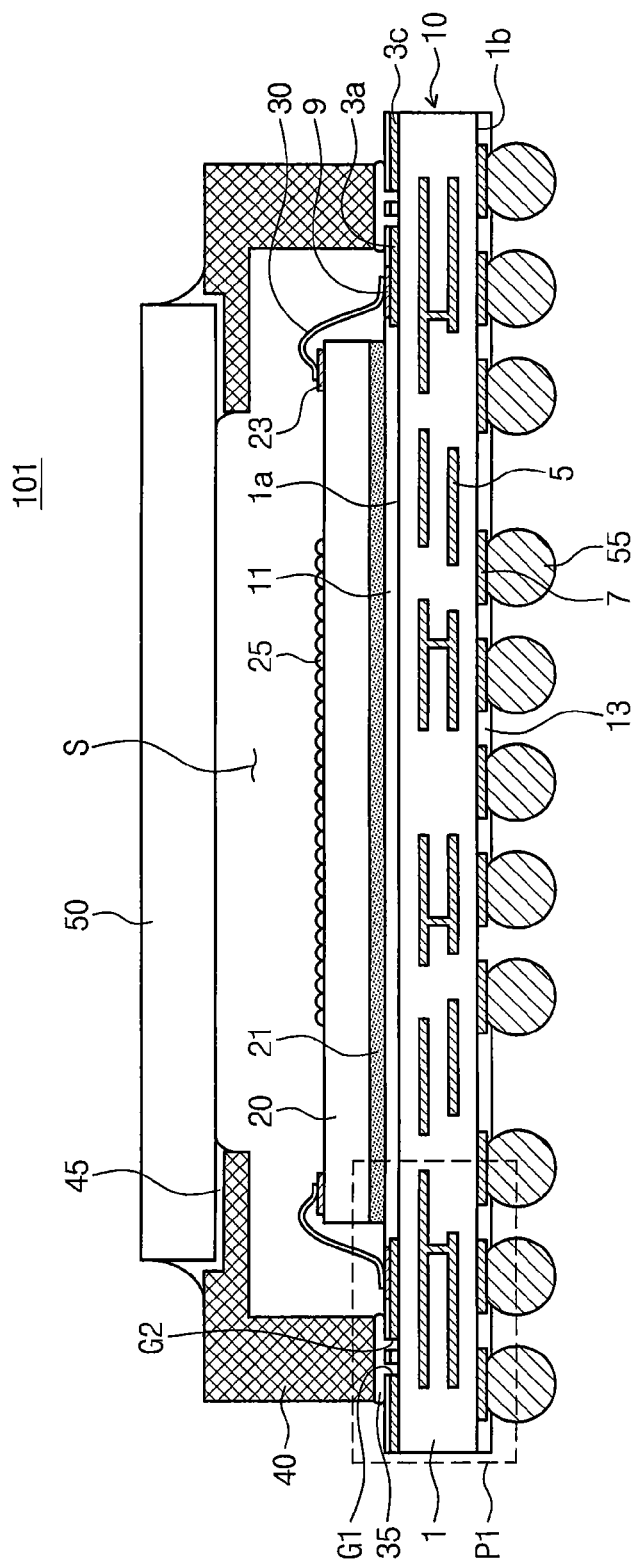
FIG. 11A is a cross-sectional view taken along a line A-A' of FIG. 10.
Figure 11B:
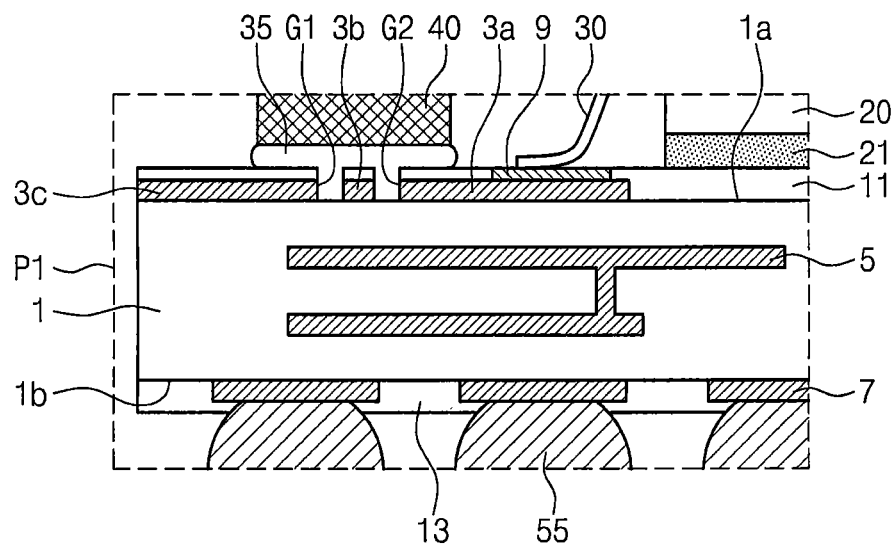
FIG. 11B is an enlarged view of a portion P1 of FIG. 11A.
Figure 11C:
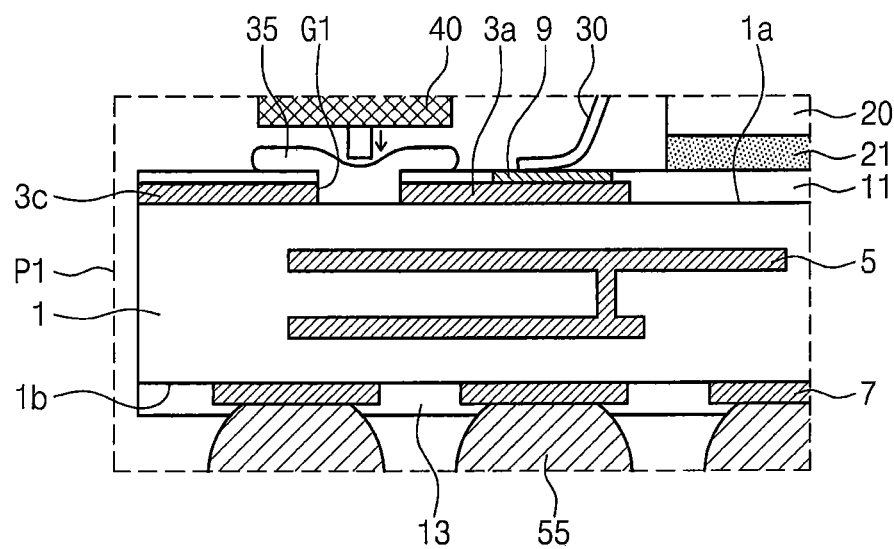
FIG. 11C is an enlarged view of the portion P1 in some embodiments according to the inventive concept.

FIG. 10 is a plan view of a semiconductor package according to some embodiments of the inventive concept. FIG. 11A is a cross-sectional view taken along a line A-A' of FIG. 10. FIG. 11B is an enlarged view of a portion P1 of FIG. 11A.

Referring to FIG. 10, FIG. 11A, and FIG. 11B, remaining conductive patterns 3b are disposed between respective first conductive patterns 3a and second conductive patterns 3c in the semiconductor package 101. Additionally, two grooves G1 and G2 may be formed at a first protective layer 11. The grooves G1 and G2 may define respective rectangular perimeters in plan view. A second adhesive layer 35 contacts the sides of the conductive patterns 3a, 3b, and 3c. The surface of the package substrate 10 may have an uneven structure at the bottom surface of the holder 40 due to the grooves G1 and G2 and the conductive patterns 3a, 3b, and 3c. Thereby, the surface area between the holder 40 and the package substrate 10 becomes broader, so that the adhesive power of the second adhesive layer 35 may be improved. The other configurations and fabricating methods may be identical/similar to those described with reference to FIGS. 1A to 9. For example, in some embodiments the conductive patterns 3b can be replaced with a portion of the holder 40 which protrudes into the initial groove G1 to divide the groove G1 into grooves G1 and G2.

Figure 12A:
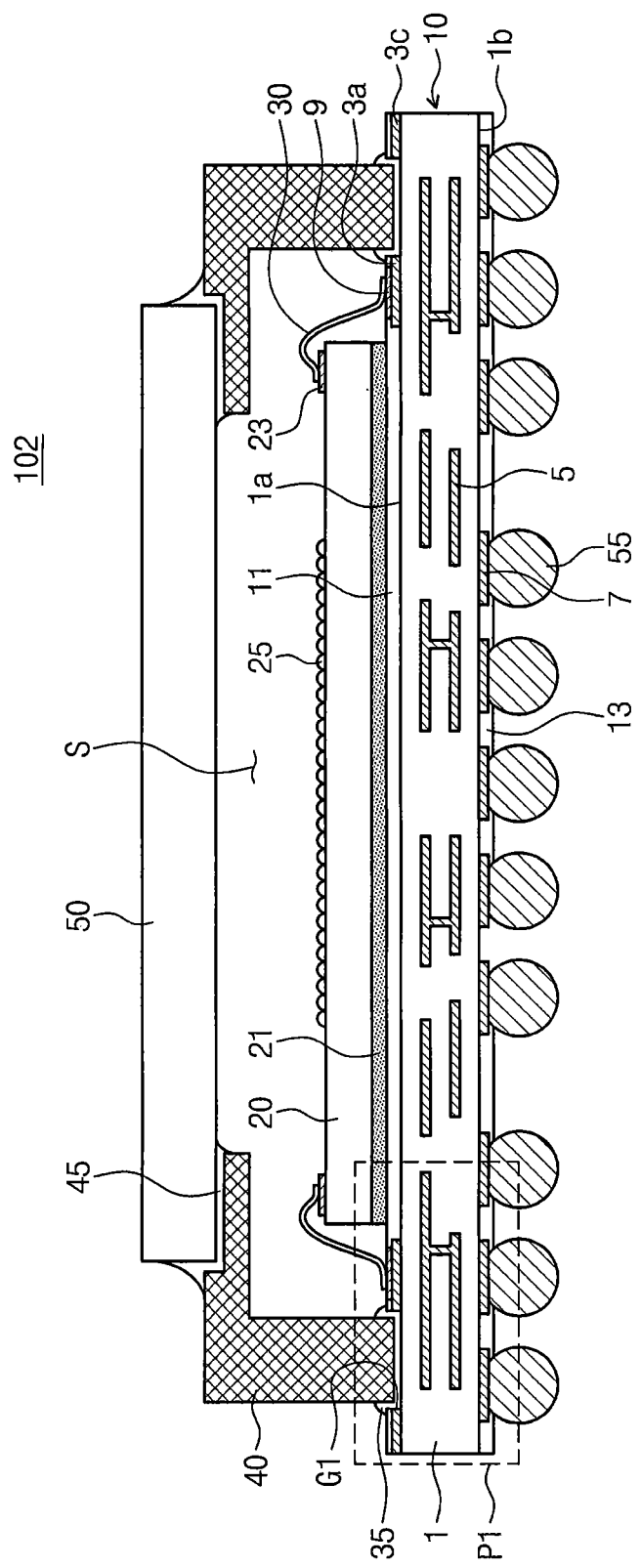
FIG. 12A is a cross-sectional view of a semiconductor package according to some embodiments of the inventive concept.
Figure 12B:
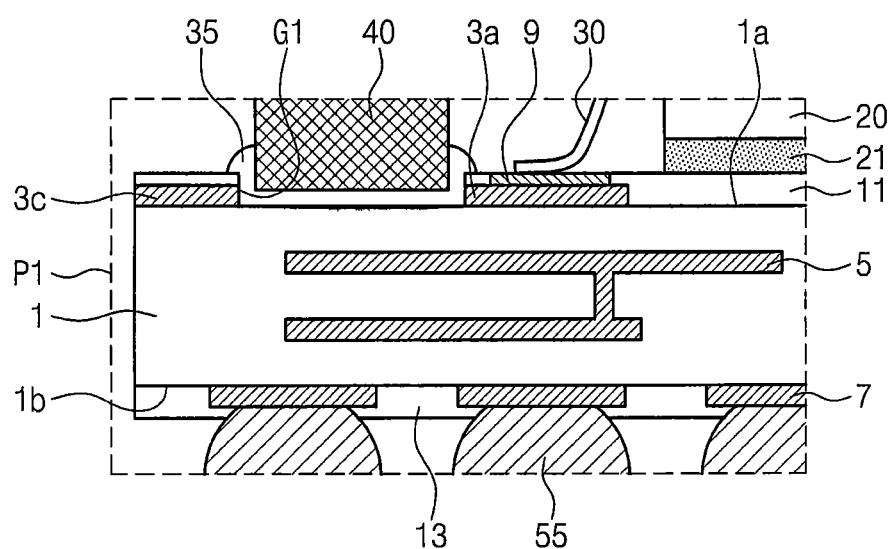
FIG. 12B is an enlarged view of a portion P1 of FIG. 12A.

FIG. 12A is a cross-sectional view of a semiconductor package according to some embodiments of the inventive concept. FIG. 12B is an enlarged view of a portion P1 of FIG. 12A.

Referring to FIGS. 12A and 12B, the bottom end of a holder 40 extends in the groove G1, so that it may horizontally overlap first conductive patterns 3a and second conductive patterns 3c. That is, the bottom end of the holder 40 extends inside the groove G1. Other configurations and fabricating methods may be identical/similar to those described with reference to FIGS. 1A to 9.

Figure 13A:
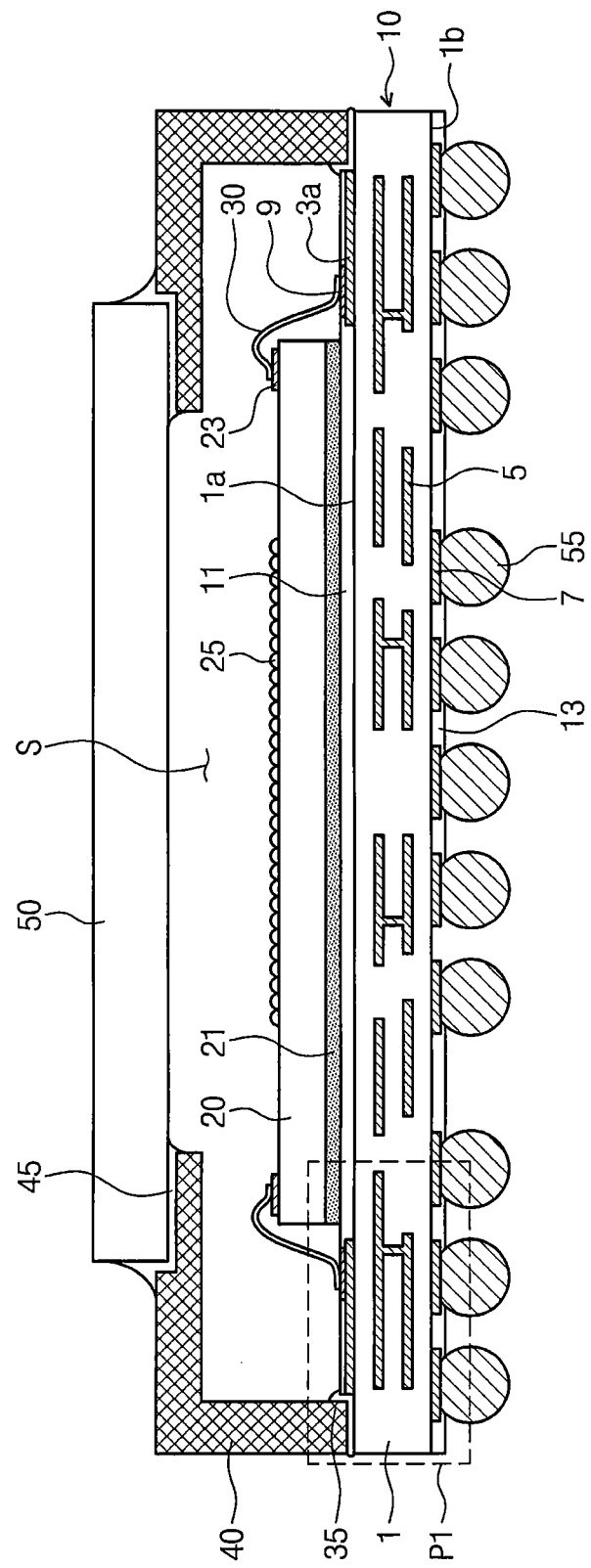
FIG. 13A is a cross-sectional view of a semiconductor package according to some embodiments of the inventive concept.
Figure 13B:
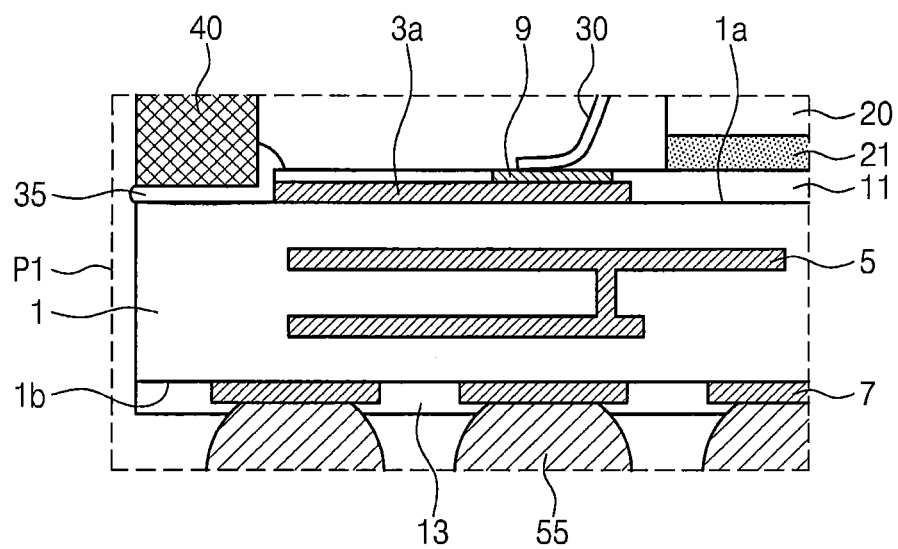
FIG. 13B is an enlarged view of a portion P1 of FIG. 13A.

FIG. 13A is a cross-sectional view of a semiconductor package according to some embodiments of the inventive concept. FIG. 13B is an enlarged view of a portion P1 of FIG. 13A.

Referring to FIGS. 13A and 13B, the semiconductor package 103 does not include second conductive patterns 3c. The holder 40 may extend laterally to the edge of a package substrate 10. A second adhesive layer 35 contacts the sides of the first conductive patterns 3a. Other configurations and fabricating methods may be identical/similar to those described with reference to FIGS. 1A to 9.

Figure 14A:
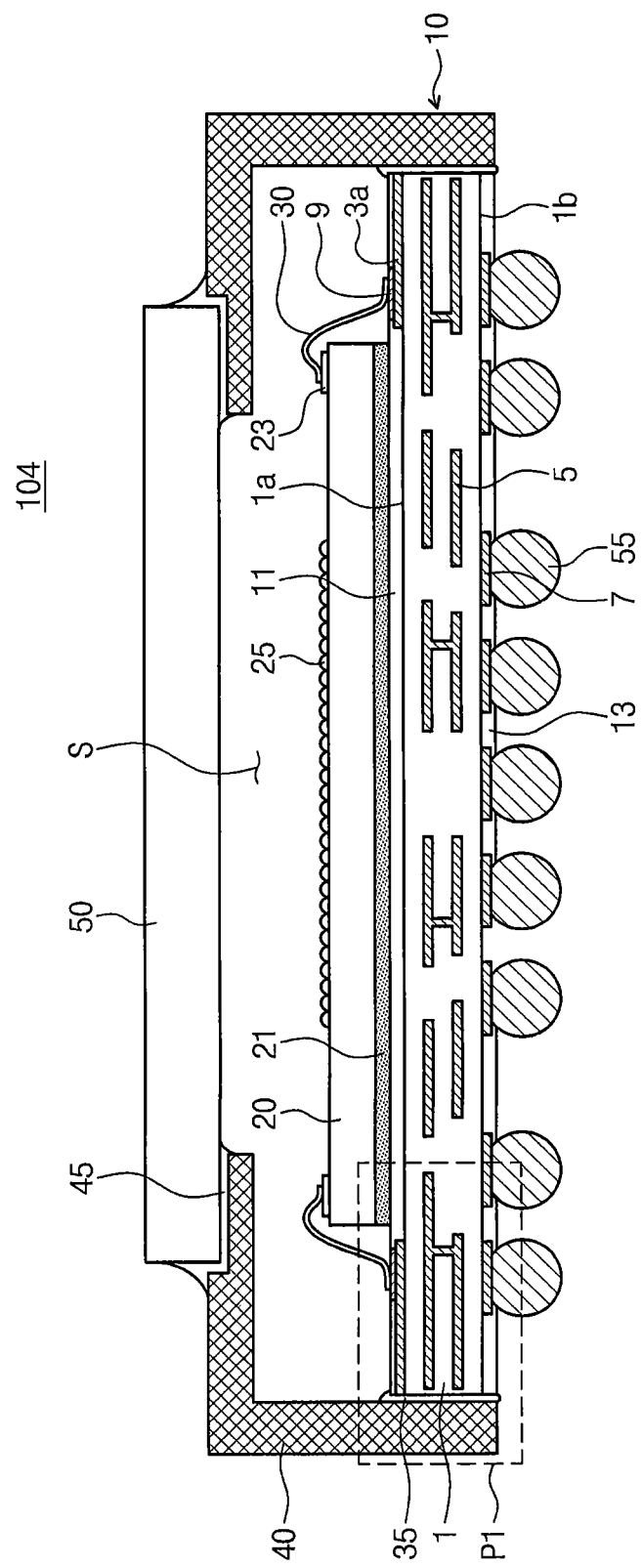
FIG. 14A is a cross-sectional view of a semiconductor package according to some embodiments of the inventive concept.
Figure 14B:
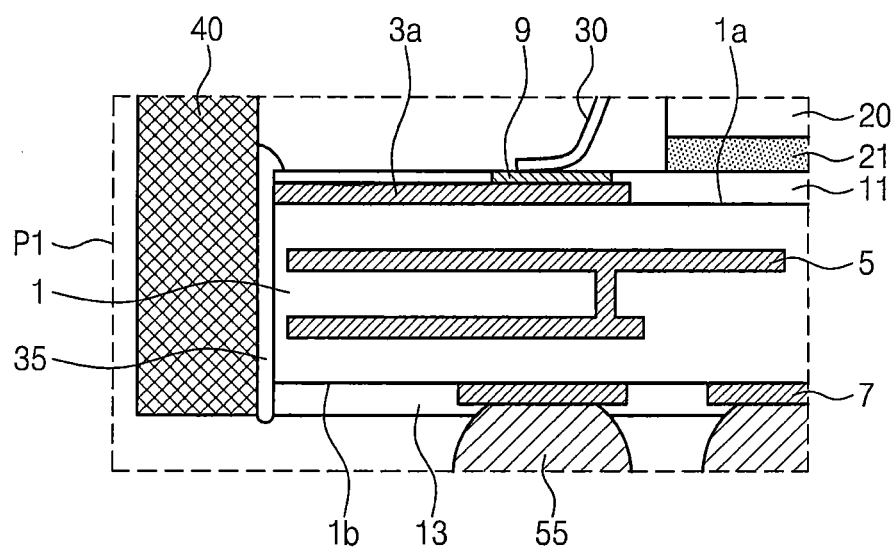
FIG. 14B is an enlarged view of a portion P1 of FIG. 14A.

FIG. 14A is a cross-sectional view of a semiconductor package according to some embodiments of the inventive concept. FIG. 14B is an enlarged view of a portion P1 of FIG. 14A.

Referring to FIGS. 14A and 14B, the semiconductor package 104 does not include second conductive patterns 3c. The first conductive patterns 3a may extend to the side of a package substrate 10. The holder 40 may extend laterally to be adjacent to the side of a package substrate 10. A second adhesive layer 35 may contact the sides of the first conductive patterns 3a and may be interposed between the interior sidewall of the holder 40 and the sidewall of the package substrate 10. A groove G1 is not formed in a first protective layer 11, rather a notch may be formed, due to the absence of the second conductive patterns. Other configurations and fabricating methods may be identical/similar to those described with reference to FIGS. 1A to 9.

Figure 15:
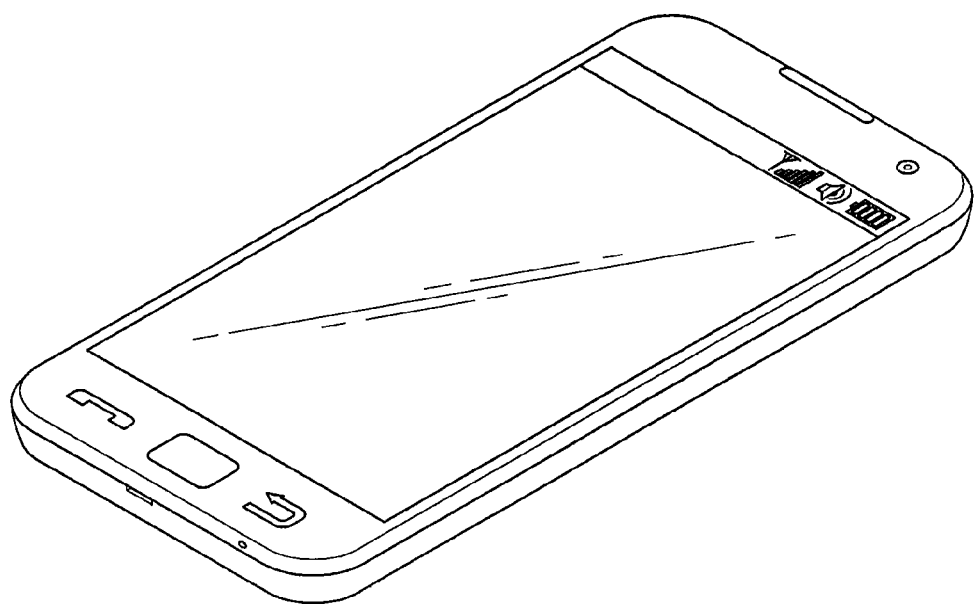
FIGS. 15 to 19 are views illustrating multimedia devices including image capturing devices according to some embodiments of the inventive concept.
Figure 16:
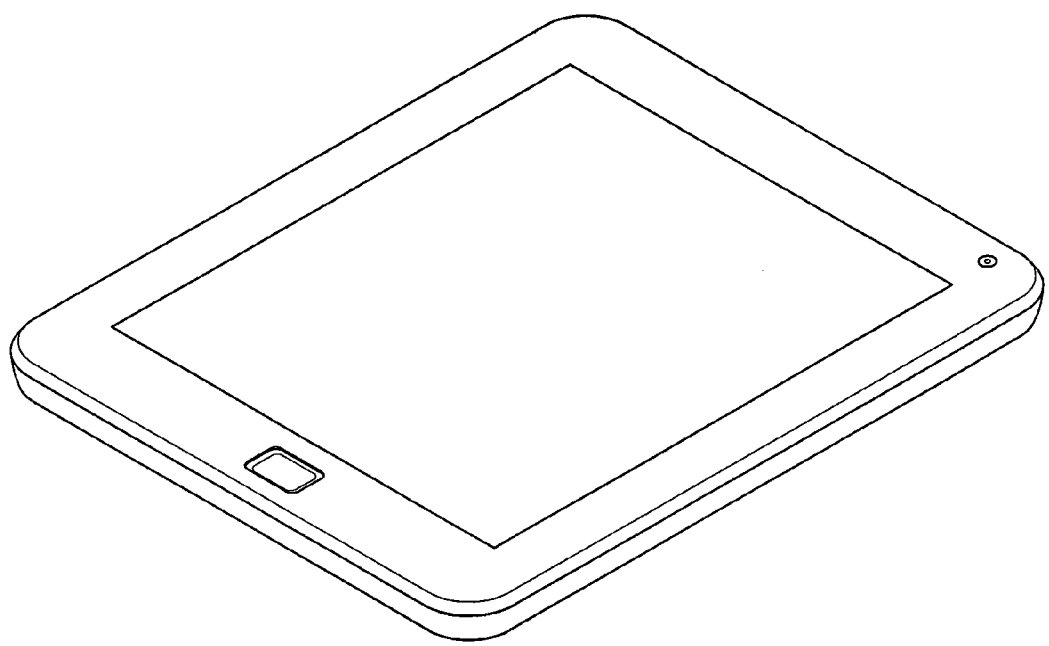
Figure 17:
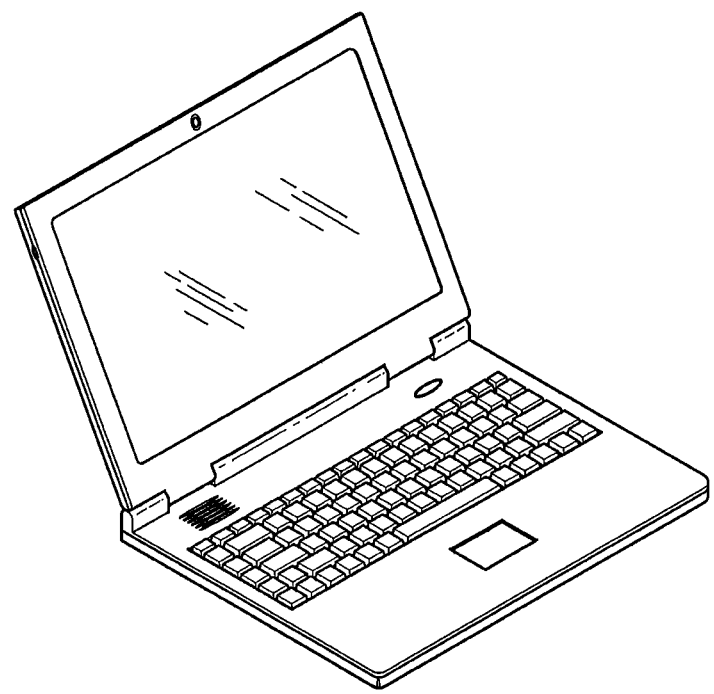
Figure 18:
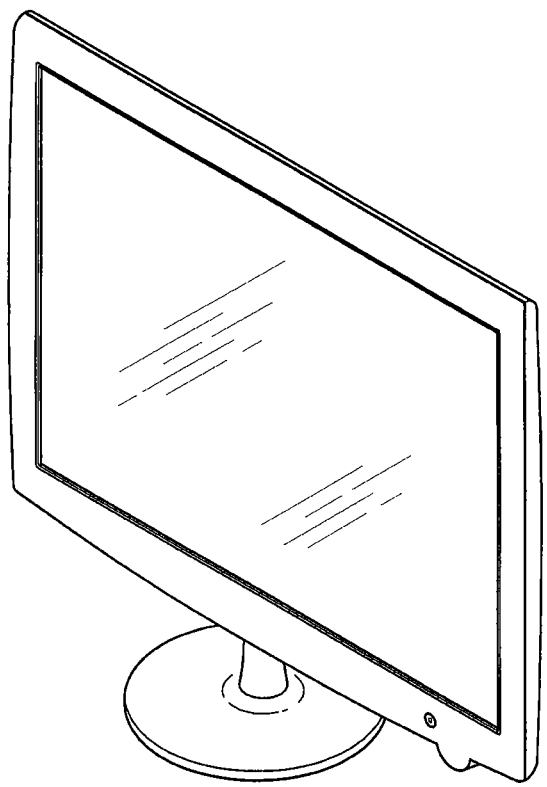
Figure 19:
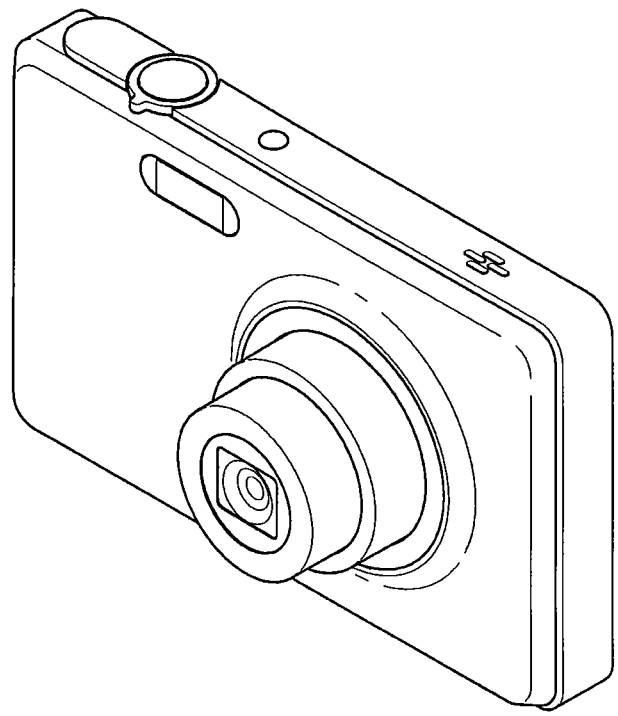

FIGS. 15 to 19 are views illustrating multimedia devices including image capturing devices according to some embodiments of the inventive concept. The image capturing device may be included in various multimedia devices that provide an image capture function. For example, the image capturing device may be included in a mobile phone or a smart phone 2000 as shown in FIG. 15 and may be included in a tablet or a smart tablet 3000 as shown in FIG. 16. Additionally, the image capturing device may be included in a notebook computer 4000 as shown in FIG. 17 and may be included in a television or a smart television 5000 as shown in FIG. 18. The image capturing device may be included in a digital camera or a digital camcorder 6000 as shown in FIG. 19.

In a semiconductor package according to the inventive concept, the side of a first conductive pattern electrically connected to a semiconductor chip contacts an adhesive layer adhering a holder and is not exposed to the outside, so that the side of the first conductive pattern does not become a path for electrostatic discharge and the deformation of the first conductive pattern may be prevented in a high temperature and high humidity environment. Thereby, the likelihood of electrical failure of the semiconductor package may be reduced and its reliability may be improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed:

1. A semiconductor package comprising:
   a package substrate including a first conductive pattern;
   a semiconductor chip mounted on the package substrate and electrically connected to the first conductive pattern;
   a holder attached to the package substrate with an adhesive layer interposed therebetween and spaced apart from the semiconductor chip;
   a transparent substrate attached on the holder and overlapping the semiconductor chip, wherein the adhesive layer contacts a side of the first conductive pattern; and
   a second conductive pattern on the package substrate being spaced apart from and electrically insulated from the first conductive pattern,
   wherein the adhesive layer contacts a side of the second conductive pattern that is directly adjacent to the side of the first conductive pattern.

2. The semiconductor package of claim 1, wherein the package substrate comprises:
   a substrate body where the first conductive pattern is disposed; and
   a protective layer covering the substrate body and a portion of the first conductive pattern.

3. The semiconductor package of claim 2, wherein a side of the protective layer is aligned with the side of the first conductive pattern.

4. The semiconductor package of claim 2, wherein a bottom end of the holder extends between the first conductive pattern and the second conductive pattern.

5. The semiconductor package of claim 2, wherein the protective layer comprises at least one groove exposing sides of the first and second conductive patterns, wherein the groove has a rectangular or bar form in plan view.

6. The semiconductor package of claim 5, wherein the adhesive layer fills the groove.

7. The semiconductor package of claim 1, wherein the semiconductor chip is an image sensor chip.

8. The semiconductor package of claim 1, wherein a surface of the package substrate below a bottom surface of the holder has an uneven structure.

9. The semiconductor package of claim 1, wherein the adhesive layer has an electrically insulating property.

10. A semiconductor package comprising:
    a substrate;
    a semiconductor chip inside the semiconductor package mounted on the substrate;
    a first conductive pattern on the substrate inside the semiconductor package and electrically connected to an input/output of the semiconductor chip;
    a holder on the substrate, the holder configured to provide a recess in which the semiconductor chip is located;
    an electrically insulating adhesive layer configured to electrically insulate the first conductive pattern from an Electric Static Discharge (ESD) source located outside the semiconductor package and configured to adhere the holder to the substrate; and
    a second conductive pattern laterally spaced apart from the first conductive pattern on the substrate, wherein the electrically insulating adhesive layer extends on the substrate from beneath the holder to the second conductive pattern.

11. The semiconductor package of claim 10 further comprising:
    the second conductive pattern extending to outside the semiconductor package and exposed to contact with the ESD source.

12. The semiconductor package of claim 11 wherein a bottom surface of the holder is coupled to the electrically insulating adhesive layer.

13. The semiconductor package of claim 12 wherein the bottom surface of the holder extends over the first and second conductive patterns and bridges a separation between the first and second conductive patterns to define a groove.

14. The semiconductor package of claim 13 wherein the electrically insulating adhesive layer fills the groove between the first and second conductive patterns.

15. The semiconductor package of claim 10 wherein the electrically insulating adhesive layer is between a side wall of the substrate and a side wall of the holder.

* * * * *